US008831051B2

(12) United States Patent
Liu et al.

(10) Patent No.: US 8,831,051 B2
(45) Date of Patent: *Sep. 9, 2014

(54) TUNABLE MULTI-WAVELENGTH SEMICONDUCTOR LASER ARRAY FOR OPTICAL COMMUNICATIONS BASED ON WAVELENGTH DIVISION MULTIPLEXING

(71) Applicant: Google Inc., Mountain View, CA (US)

(72) Inventors: Hong Liu, Palo Alto, CA (US); Cedric F. Lam, Milpitas, CA (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/887,064

(22) Filed: May 3, 2013

(65) Prior Publication Data

US 2013/0315269 A1    Nov. 28, 2013

Related U.S. Application Data

(63) Continuation of application No. 12/788,121, filed on May 26, 2010, now Pat. No. 8,457,165.

(51) Int. Cl.
| | |
|---|---|
| *H01S 3/10* | (2006.01) |
| *H01S 5/06* | (2006.01) |
| *H04B 10/50* | (2013.01) |
| *H01S 5/0625* | (2006.01) |
| *H01S 5/026* | (2006.01) |
| *H01S 5/12* | (2006.01) |
| *H01S 5/00* | (2006.01) |
| *H01S 5/40* | (2006.01) |

(52) U.S. Cl.
CPC .............. *H01S 5/06* (2013.01); *H01S 5/0265* (2013.01); *H04B 10/506* (2013.01); *H01S 5/06256* (2013.01); *H01S 5/1209* (2013.01); *H01S 5/005* (2013.01); *H01S 5/4087* (2013.01)
USPC .......... 372/20; 372/50.121; 372/96; 372/102

(58) Field of Classification Search
CPC ......... H01S 5/005; H01S 5/0265; H01S 5/06; H01S 5/06256; H01S 5/1209; H01S 5/1215; H01S 5/4087
USPC ......................................................... 372/20
See application file for complete search history.

(56) References Cited

U.S. PATENT DOCUMENTS

| 6,654,400 B1 | 11/2003 | Mason et al. |
|---|---|---|
| 6,868,100 B2 | 3/2005 | Larson et al. |
| 7,027,469 B2 | 4/2006 | Sidorin et al. |

(Continued)

FOREIGN PATENT DOCUMENTS

| EP | 1291988 A1 | 3/2003 |
|---|---|---|
| WO | WO 2007/074979 A1 | 7/2007 |

OTHER PUBLICATIONS

U.S. Appl. No. 13/902,425—Non-Final Office Action, mailed Dec. 9, 2013, 22 pages.

(Continued)

*Primary Examiner* — Xinning Niu
(74) *Attorney, Agent, or Firm* — Edward A. Gordon; Foley & Lardner LLP

(57) ABSTRACT

Techniques, devices and systems for optical communications based on wavelength division multiplexing (WDM) that use tunable multi-wavelength laser transmitter modules.

20 Claims, 8 Drawing Sheets

(56) References Cited

U.S. PATENT DOCUMENTS

| | | | |
|---|---|---|---|
| 7,221,820 B2 | 5/2007 | Boertjes et al. | |
| 7,245,829 B1 | 7/2007 | Sindile | |
| 7,380,993 B2 | 6/2008 | Dallesasse | |
| 8,457,165 B2 * | 6/2013 | Liu et al. ........................ | 372/20 |
| 2002/0181532 A1 | 12/2002 | Ryu et al. | |
| 2004/0076199 A1 | 4/2004 | Wipiejewski et al. | |
| 2004/0252367 A1 | 12/2004 | Lee et al. | |
| 2005/0030990 A1 | 2/2005 | O'Gorman | |
| 2005/0249509 A1 | 11/2005 | Nagarajan et al. | |
| 2007/0077068 A1 | 4/2007 | Mazed | |
| 2010/0054741 A1 | 3/2010 | Urino | |
| 2011/0292953 A1 | 12/2011 | Liu et al. | |
| 2011/0293279 A1 | 12/2011 | Lam et al. | |

OTHER PUBLICATIONS

European Patent Application No. 11167739.9, Partial European Search Report, issued Sep. 1, 2011, 7 pages.

European Patent Application No. 11167739.9, Extended European Search Report, mailed Nov. 15, 2011, 17 pages.

U.S. Appl. No. 12/788,204—Non-Final Office Action, mailed Jun. 21, 2012, 17 pages.

U.S. Appl. No. 12/788,204—Non-Final Office Action, mailed Nov. 5, 2012, 17 pages.

Lee, San-Liang et al., "Trend and Applications of Tunable Semiconductor Lasers", Optoelectronic Materials and Devices II, Proceedings of the International Society for Optical Engineering, vol. 6782, Nov. 19, 2007, pp. 67821H-1-67821H-10, 10 pages.

Sarlet, Gert, "Tunable Laser Diodes for WDM Communication Methods for Control and Characterisation", RUG. Fatculteit Toegepaste Wetenschappen (TW), Vakgroep Informatietechnologie (TW05), Gent Universiteit, 2000, XP2002661979, Retrieved from Internet on Nov. 18, 2011, 267 pages, Ghent, Belgium, <http://lib.ugent.be/fulltxt/RUG01/000/518/840/RUG01-000518840_2010_0001_AC.pdf>.

V. Jayaraman et al., "Theory, Design, and Performance of Extended Tuning Range Semiconductor Lasers with Sampled Gratings," IEEE J. Quantum Electronics, vol. 29, No. 6, Jun. 1993, pp. 1824-1834.

Jens Buus et al., "Tunable Laser Diodes and Related Optical Sources," Second Edition, 2005, 393 pages, Wiley-IEEE, Hoboken, New Jersey.

* cited by examiner

US 8,831,051 B2

TUNABLE MULTI-WAVELENGTH SEMICONDUCTOR LASER ARRAY FOR OPTICAL COMMUNICATIONS BASED ON WAVELENGTH DIVISION MULTIPLEXING

CROSS-REFERENCE TO RELATED APPLICATION

The present patent application is a continuation of U.S. application Ser. No. 12/788,121, filed on May 26, 2010, now pending.

TECHNICAL FIELD

This specification relates to lasers, optical transmitters and optical transceivers and their applications in optical communications based on wavelength division multiplexing (WDM).

BACKGROUND INFORMATION

Various optical fiber transmission systems use optical WDM transceivers to transmit and receive data by combining a number of different optical channels or signals at different WDM wavelengths onto a single fiber. Light at these WDM wavelengths is modulated as optical signals at different WDM wavelengths to carry data of different signals, respectively. For example, an optical fiber transmission system can be designed to include n number of optical WDM channels each with a data rate of m Gb/s to transmit through a single fiber with data throughput rate at n×m Gb/s. As such, data transmission at a data throughput rate of 100 Gb/s can be achieved by using, for example, 10 optical WDM channels each at a channel data rate of 10 Gb/s or 4 optical WDM channels each at a channel data rate of 25 Gb/s. To achieve a sufficiently high data throughput rate at n×m Gb/s, the number of optical WDM channels, n, can be increased to reduce the data rate m per optical channel to advantageously use relatively matured low-data-rate optical WDM technologies and the associated CMOS electronic technologies for the electronic driver and data processing circuits.

Optical WDM transceivers can be in various configurations where each transceiver includes a transmitter part that transmits one or more optical WDM signals and a receiver part that receives one or more optical WDM signals. An integrated multi-wavelength WDM transceiver is a transceiver in a compact platform that allows multiple streams of data to be simultaneously placed on a single physical input and output (I/O) port using multiple optical WDM wavelengths from an array of lasers operated at the optical WDM wavelengths. Such integration offers a number of advantages including low power operation, spatial and cost efficiency, improved system reliability, and operational simplicity. In various optical WDM systems, integrated Coarse WDM (CWDM) or Dense WDM (DWDM) compact form pluggable (CFP) transceivers can be used to offer an economical and power-efficient way to implement 100-Gb/s transmission on a single fiber by an array of CWDM or DWDM lasers, each transmitting at 10 Gb/s or 25 Gb/s aligning with CMOS electronic drive speeds.

SUMMARY

This specification describes, among others, techniques, devices and systems for optical communications based on wavelength division multiplexing that use tunable multi-wavelength laser transmitter modules.

In one aspect, a device for producing laser light at different optical wavelengths is provided to include an array of tunable lasers to produce laser light at different optical wavelengths, respectively. Each tunable laser includes a tunable sampled Bragg grating reflector responsive to an electrical control signal to produce tunable reflectivity peaks within a tunable spectral range, a second grating reflector that is spaced from the sampled Bragg grating reflector to form an optical resonator with the sampled Bragg grating reflector and produces reflectivity peaks at different second grating reflector resonance wavelengths within the tunable spectral range of the tunable sampled Bragg grating reflector, and a gain section between the tunable sampled Bragg grating reflector and the second grating reflector. The gain section is capable of being electrically energized to produce an optical gain for the laser light at a respective optical wavelength produced by the tunable laser. This device includes a laser control unit electrically coupled to the tunable lasers to apply the electrical control signal as a common control signal to the tunable sampled Bragg grating reflector in each of the tunable lasers to synchronously tune the tunable lasers that operate the different optical wavelengths, respectively.

In another aspect, a method for producing laser light at different optical wavelengths is provided to include operating an array of tunable lasers to produce laser light at different optical wavelengths, respectively, where each tunable laser includes a tunable sampled Bragg grating reflector responsive to an electrical control signal to tune a respective optical wavelength; and applying a common electrical control signal to the tunable lasers as the electrical control signal to each tunable sampled Bragg grating reflector to synchronously tune the tunable lasers that operate at the different optical wavelengths, respectively.

In another aspect, a device for producing laser light at different optical wavelengths is provided to include a substrate and a semiconductor structure formed on the substrate and patterned to form an array of tunable lasers to produce laser light at different optical wavelengths, respectively, optical modulators located to receive and modulate the laser light from the tunable lasers to carry information, respectively, and a beam combiner that receives laser light from the optical modulators to produce a combined optical output. Each tunable laser includes a tunable sampled Bragg grating reflector responsive to an electrical control signal to tune a respective optical wavelength produced by the tunable laser. This device includes a laser control unit electrically coupled to the tunable lasers to apply a common electrical control signal to the tunable lasers as the electrical control signal to each tunable sampled Bragg grating reflector to synchronously tune the tunable lasers that operate at the different optical wavelengths, respectively.

In another aspect, a method for optical communications based on wavelength division multiplexing (WDM) includes providing tunable laser transmitter modules based on a common tunable laser transmitter module design which includes (1) a plurality of tunable laser modules to produce laser light at different optical WDM wavelengths to carry different WDM signal channels, respectively. Each tunable laser module is operable to tune a respective optical WDM wavelength, and (2) a beam combiner that includes input ports that are respectively coupled to receive the laser light from the tunable laser modules and an output port that combines the received laser light from the tunable laser modules into a combined optical output carrying light at the different optical WDM wavelengths. The beam combiner is structured to exhibit a common transmission spectral profile from each input port to the output port that has periodic repetitive transmission bands that are adjacent to one another in wavelength and extend to cover different WDM sub-bands. Each transmission band has a spectral width to cover a predetermined number of WDM wavelengths. In this method, the tunable laser transmitter modules is operated to produce WDM optical signals at different optical WDM wavelengths in different WDM sub-bands, one tunable laser transmitter module producing laser light at optical WDM wavelengths per WDM sub-band. The laser light at a respective optical WDM wavelength from each tunable laser transmitter module is modulated to produce a respective WDM optical signal carrying information of a respective WDM channel. This method uses a band multiplexer to receive and to combine the WDM signals in the different WDM sub-bands from the tunable laser transmitter modules into a combined WDM optical output for transmission over a fiber link.

In another aspect, a device for optical communications based on wavelength division multiplexing (WDM) includes a plurality of tunable laser transmitter modules based on a common tunable laser transmitter module design which includes (1) an array of tunable laser modules to produce laser light at different optical WDM wavelengths to carry different WDM signal channels, respectively, each tunable laser module operable to tune a respective optical WDM wavelength, and (2) a beam combiner that includes input ports that are respectively coupled to receive the laser light from the tunable laser modules and an output port that combines the received laser light from the tunable laser modules into a combined optical output carrying light at the different optical WDM wavelengths. The beam combiner is structured to exhibit a common transmission spectral profile from each input port to the output port that has periodic repetitive transmission bands that are adjacent to one another in wavelength and extend to cover different WDM sub-bands and each transmission band having a spectral width to cover a predetermined number of WDM wavelengths. This device includes a control unit that controls the tunable laser transmitter modules to produce WDM optical signals at different optical WDM wavelengths in different WDM sub-bands, respectively; and a band multiplexer coupled to receive and to combine the WDM optical signals in the different WDM sub-bands from the tunable laser transmitter modules into a combined WDM optical output for transmission over a fiber link.

In another aspect, a device for optical communications based on wavelength division multiplexing (WDM) includes an array of tunable laser modules to produce laser light at different optical WDM wavelengths to carry different WDM signal channels, respectively and each tunable laser module is operable to tune a respective optical WDM wavelength. This device includes a beam combiner that includes input ports that are respectively coupled to receive the laser light from the tunable laser modules and an output port that combines the received laser light from the tunable laser modules into a combined optical output carrying light at the different optical WDM wavelengths. The beam combiner is structured to exhibit a common transmission spectral profile from each input port to the output port that has periodic repetitive transmission bands that are adjacent to one another in wavelength and extend to cover different WDM sub-bands and each transmission band having a spectral width to cover a predetermined number of WDM wavelengths. A control unit is included in this device to control the tunable laser modules to produce WDM optical signals at different optical WDM wavelengths, respectively.

In yet another aspect, a device for optical communications based on wavelength division multiplexing (WDM) includes tunable laser transmitter modules to transmit WDM signals at different WDM sub-bands, respectively. Each tunable laser transmitter module produces laser light of different WDM signals in a respective WDM sub-band and includes (1) tunable laser modules that produce laser light at different optical WDM wavelengths within a respective WDM sub-band to carry different WDM signal channels within the respective WDM sub-band, respectively, each tunable laser operable to tune a respective optical WDM wavelength, and (2) a beam combiner that includes input ports that are respectively coupled to receive the laser light from the tunable laser modules and an output port that combines the received laser light from the tunable laser modules into a combined optical output carrying light at the different optical WDM wavelengths. The beam combiner is structured to exhibit a common transmission spectral profile from each input port to the output port that has periodic repetitive transmission bands that are adjacent to one another in wavelength and extend to cover the different WDM sub-bands, wherein each transmission band has a spectral width to cover a predetermined number of WDM wavelengths. This device includes a band multiplexer that is coupled to receive WDM signals at the different WDM sub-bands from the tunable laser transmitter modules and to combine the received WDM signals into a combined WDM optical output for transmission over a fiber link; a band splitter that is coupled to receive an input WDM signal carrying input WDM signals at the different WDM sub-bands and separates the WDM signals into different groups of input WDM signals within the different WDM sub-bands, respectively, along different optical paths; and optical receiver modules to receive the different groups of input WDM signals at the different WDM sub-bands, respectively. Each optical receiver module includes (1) a wavelength splitter that includes an input port coupled to receive a respective group of input WDM signals within a respective WDM sub-band and output ports that output the received input WDM signals of the respective group along different output optical paths. The wavelength splitter is structured to exhibit a common transmission spectral profile from the input port to each output port that has periodic repetitive transmission bands at are adjacent to one another in wavelength and extend to cover the different WDM sub-bands, and (2) optical detectors coupled to receive the received input WDM signals of the respective group and to convert the received input WDM signals into different electrical detector signals, respectively.

Particular embodiments of the invention can be implemented to realize one or more of advantages. For example, a tunable transmitter module can use tunable laser modules to produce tunable multi-wavelength optical signals and can be implemented to provide flexibility and simplicity in implementation and inventory management. A tunable transceiver can be configured to achieve a high level of integration at a relatively low cost.

The details of one or more embodiments of the invention are set forth in the accompanying drawings and the description below.

BRIEF DESCRIPTION OF THE DRAWINGS

Like reference numbers and designations in the various drawings indicate like elements.

DETAILED DESCRIPTION

Figure 1:
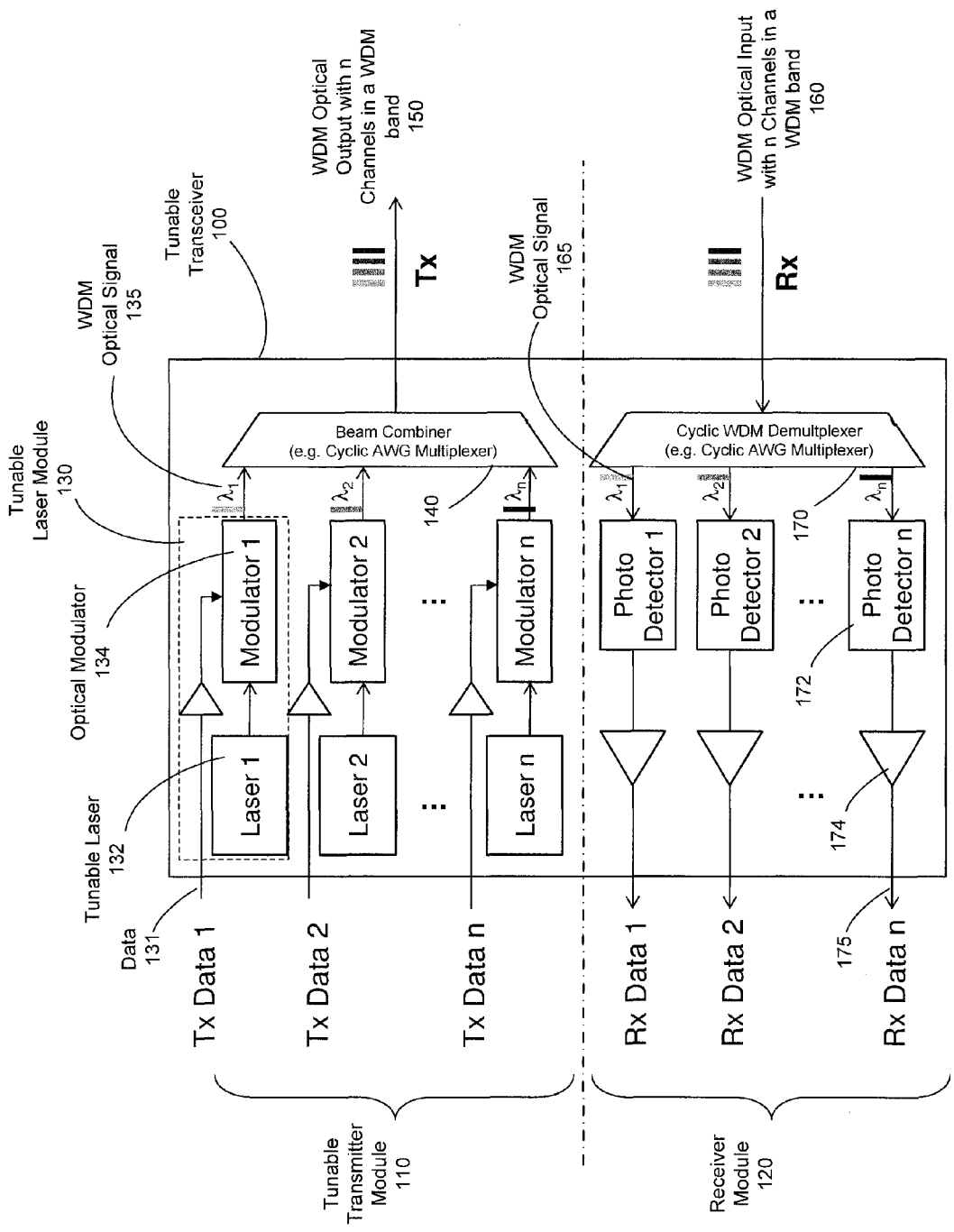
FIG. 1 illustrates an example of a tunable multi-wavelength optical transceiver having tunable laser modules that respectively generate different WDM signals at different WDM wavelengths.

FIG. 1 illustrates an example of a tunable multi-wavelength optical transceiver 100 having tunable laser modules 130 that respectively generate different WDM signals at different WDM wavelengths. The transceiver 100 includes a tunable transmitter module 110 based on the tunable laser modules 130 to produce a WDM optical output 150 that carries multiple output WDM channels within a WDM spectral band, and a receiver module 120 that receives a WDM optical input 160 that carries multiple input WDM channels within the same WDM spectral band. In implementations, the tunable transceiver 100 in FIG. 1 can be configured and packaged in various configurations to meet specific requirements of WDM applications. For example, the transceiver 100 can be configured as a pluggable module based on the industry's multi-source agreement (MSA) for making a 40 GbE interface and a 100 GbE interface.

The tunable transmitter module 110 uses the tunable laser modules 130 to produce tunable multi-wavelength optical signals 135 and can be implemented to provide flexibility and simplicity in implementation and inventory management. The transceiver 100 can be configured to achieve a high level of integration in a single package at a relatively low cost and to operate at a reduced power consumption. Multiple transceivers 100 can be used in a WDM system and are tuned to produce WDM signals in multiple WDM sub-bands within a WDM band and such WDM signals in the multiple WDM sub-bands are combined to generate a high throughput data rate, e.g., 100 Gb/s or higher.

The tunable transmitter module 110 in FIG. 1 includes tunable laser modules 130 to transmit WDM signals 135 at different WDM wavelengths, respectively. The different WDM wavelengths can be WDM wavelengths based on, e.g., the International Telecommunication Union (ITU) WDM grid specification in the L, C and S bands for WDM applications. Each tunable laser module 130 is operable to tune a respective optical WDM wavelength to a desired value, e.g., an ITU WDM wavelength. In some implementations, each tunable laser module 130 can include a tunable semiconductor laser that directly produces modulated laser light as a respective WDM optical signal carrying information of a respective WDM channel by modulating, e.g., a driving current applied to the semiconductor laser. In other implementations, such as the specific example illustrated in FIG. 1, each tunable laser module 130 can include a tunable laser 132, e.g., a semiconductor laser, that produces continuous wave (CW) laser light at a WDM wavelength, and an optical modulator 134 that is located to receive the CW laser light from the tunable laser and modulates the CW laser light to produce the respective WDM optical signal 135 carrying information of the respective WDM channel. Data 131 for the respective WDM channel is carried by a modulator control signal which is applied to the optical modulator 134. In response to the modulator control signal carrying the data 131, the optical modulator performs the optical modulation on the CW laser light. The optical modulator 134 may be implemented in various configurations, such as an electro-optic Mach-Zehnder modulator (MZM) or an electro-absorption modulator (EAM). FIG. 1 shows n WDM channels are generated at n different WDM wavelengths $\lambda 1, \lambda 2, \ldots,$ and $\lambda n$. A control unit is provided in the transceiver 100 to control and to tune the tunable laser modules 130 to produce WDM optical signals at desired different optical WDM wavelengths, respectively. This tunability of the transceiver 100 allows the same transceiver 100 to be tuned to operate in different optical spectral bands such as different WDM sub-bands within a particular WDM band such as the C-band, L-band, S-band and other optical transmission bands for optical communications. In WDM system deployment, multiple identically constructed transceivers 100 can be installed in the same transmit subsystem and tuned to produce WDM signals in different WDM sub-bands. This aspect in the design of the transceiver 100 eliminates the need for making different transceivers for producing different sets of WDM signals in different WDM sub-bands of a given WDM band and allows the same transceiver 100 to function as transceivers for different WDM sub-bands.

The transceiver 100 includes a beam combiner 140 that is located downstream from the tunable laser modules 130 to receive the WDM signals 135 and combines the received WDM signals 135 at different optical WDM wavelengths into the combined optical output 150. The beam combiner 140 includes input ports that are respectively coupled to receive the laser light from the tunable laser modules 130 and a common output port that outputs the combined optical output 150. Notably, the beam combiner 140 is structured to exhibit a common transmission spectral profile from each input port to the common output port that has periodic or cyclic, repetitive transmission bands that are adjacent to one another in wavelength and extend to cover different WDM sub-bands within a WDM band. Each transmission band has a spectral width to cover a predetermined number of WDM wavelengths. This cyclic spectral property of the beam combiner 140 combines with the tenability of the laser modules 130 to provide the versatile operating capability of the tunable transceiver 100 for producing different WDM signals in different WDM sub-bands.

Figure 2:
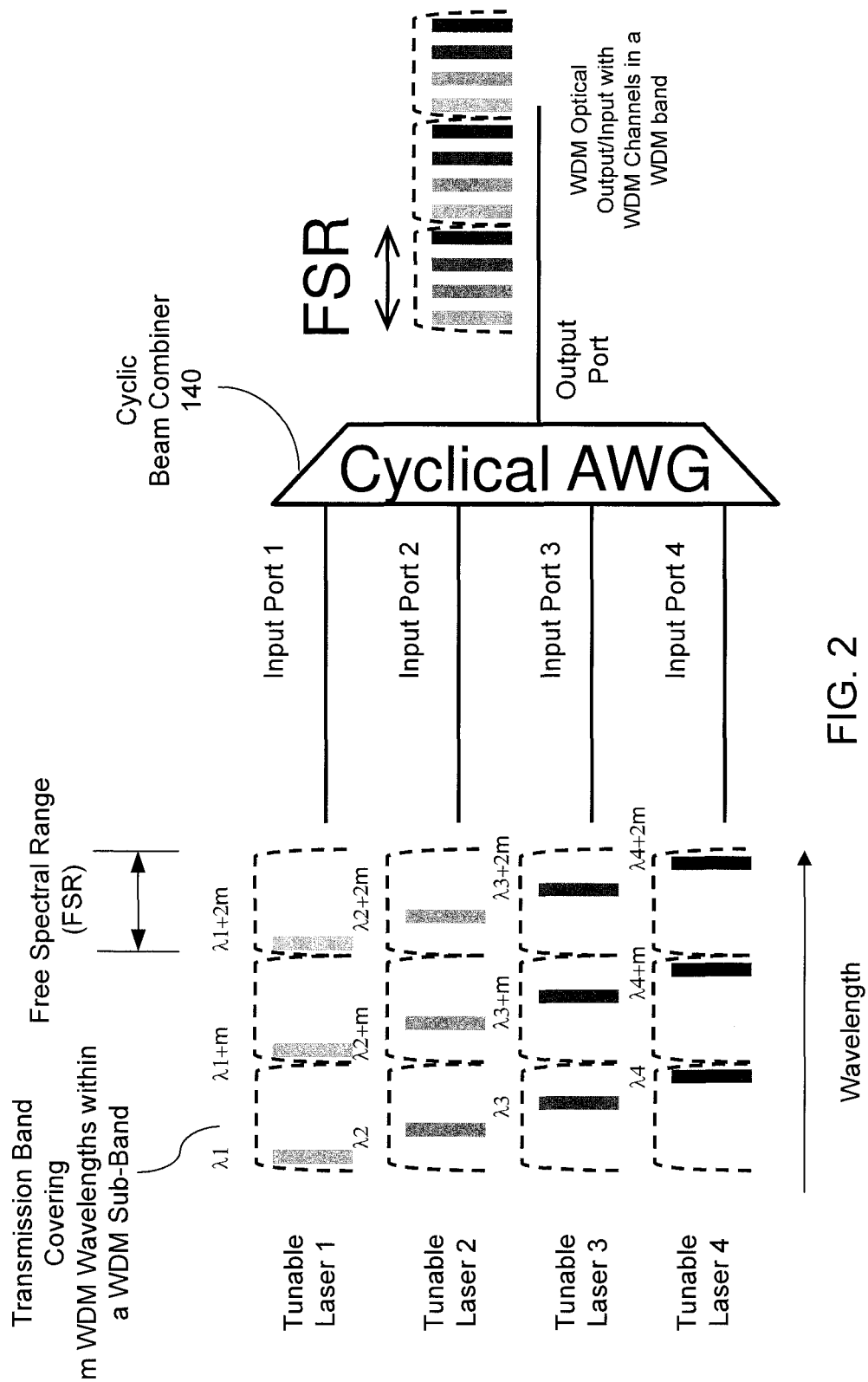
FIG. 2 illustrates an example of tuning tunable lasers to different WDM wavelengths, respectively, that fall within a common transmission band of the common transmission spectral profile of a cyclic beam combiner.

FIG. 2 shows one exemplary implementation of the cyclic beam combiner 140 in form of a cyclic arrayed-waveguide grating (AWG) multiplexer, where outputs of four tunable lasers 1-4 are respectively coupled to four input ports 1-4 of the cyclic AWG multiplexer and are combined as the WDM optical output at the AWG output port. The common transmission spectral profile from each input port to the common output port is shown on the left side of each input port, illustrating three consecutive transmission bands. Each of the transmission bands occupies a spectral width within the free spectral range (FSR) that defines the periodicity of the repetitive spectral response of the cyclical AWG multiplexer and covers multiple WDM wavelengths. Such transmission bands can serve as the WDM sub-bands within a particular WDM band, e.g., the C-band from 1529 nm to 1565 nm, the L-band from 1565 nm to 1625 nm, the S-band from 1460 nm to 1530 nm, and other bands.

The tunable lasers 1-4 can be tuned to 4 different WDM wavelengths within one or more of the transmission bands of the common transmission spectral profile for each input port of the cyclic AWG multiplexer 140. Various tuning arrangements may be implemented.

FIG. 2 illustrates an example of tuning the tunable lasers to 4 different WDM wavelengths, respectively, that fall within a common transmission band of the common transmission spectral profile. For example, the four different WDM wavelengths λ1, λ2, λ3, and λ4 from the tunable lasers 1-4, respectively can be four consecutive WDM wavelengths in the same transmission band as shown in FIG. 2. In the illustrated example in FIG. 2, a particular tuning configuration is also shown in which each tunable laser is tuned at a coarse step by a change of one FSR. Assuming the FSR covers m different WDM wavelengths or channels, the first tunable laser operating at λ1 can be tuned to the next wavelength λ1+m) in the next transmission band. The four tunable lasers 1-4 can be tuned in synchronization to their respective positions in the next transmission band. Under this specific tuning design, each tunable laser is tuned by tuning the laser frequency from one FSR to the next FSR with an equal channel spacing of one FSR between the two consecutive tuned laser frequencies. For tuning within the C-band, for example, the spectral range of the C-band can be divided into spectral ranges known as sub-bands corresponding to the transmission bands of the common transmission spectral profile for each input port of the cyclic AWG multiplexer 140. In tuning each tunable laser, the wavelength from the tunable laser is tuned to hop at a coarse step by one FSR from one transmission sub-band to the next transmission sub-band. A common laser control signal can be applied to the four tunable lasers 1-4 in a way that synchronously tune the four tunable lasers 1-4 at the same time. A control circuit can be used to generate the common laser control signal and is coupled to the lasers to apply the common laser control signal to the lasers. In operation, the control circuit adjusts the common laser control signal to synchronously tune all four lasers Under the above tuning design, the FSR of the cyclic AWG multiplexer 140 may be equal to n×Δf, where Δf is the channel spacing, n is the number of tunable lasers in an array. Thus, an operating spectrum range can be divided into $$l = \frac{\text{spectrum}}{n \times \Delta f}$$

number of sub bands, l is also the number of wavelengths that each laser in the array could be tuned to in the whole spectrum band. For example, for the whole C band (wavelength from 1529 nm to 1560 nm) with 100 GHz (0.8 nm) wavelength spacing, the number of sub bands that can be obtained is $$l = \frac{32 \text{ nm}}{n \times 0.8 \text{ nm}}.$$

Under the above tuning design, when n tunable lasers are implemented in the tunable transceiver, each laser is tuned discontinuously at a tuning step of n×Δ. For example, assuming the WDM wavelength spacing is 100 GHz, the tuning step is n×100 GHz (or n×0.8 nm). To cover the full range of a 32 nm C-band with a wavelength from 1529 nm to 1560 nm, a wavelength spacing of 100 GHz (0.8 nm) and a number of l sub bands, the tuning range of each laser in a laser array may only be a ratio of (l−1)×(32/l) nm. When l=4, the tuning range of each laser needs to be 24 nm instead of 32 nm.

In above example of the AWG multiplexer for implementing the beam combiner 140 can be implemented in various AWG configurations, including a cyclic Echelle grating multiplexer. Other devices can also be used to perform the function of the beam combiner 140. For example, the beam combiner 140 can include a set of cascaded comb filters such as Fabry-Perot filters with periodic frequency responses. In addition, a wide-band n×1 power coupler, which has a loss of 10×log(n) dB, can be used to replace the cyclical AWG as the beam combiner 140.

Referring back to FIG. 1 for the tunable transceiver 100, the receiver module 120 includes a beam splitter 170 that is wavelength selective and includes an input port coupled to receive a WDM optical input 160 containing input WDM signals within the same WDM band output by the tunable transmitter module 110. The beam splitter 170 includes output ports that output the received input WDM signals at different WDM wavelengths along different output optical paths. When the beam combiner 140 is implemented to have the spectral properties of the cyclic AWG multiplexer, the beam splitter 170 can structured to exhibit the same or similar common transmission spectral profile from the input port to each output port as that in the beam combiner 140. The beam splitter 170 can be implemented in various configurations, including a cyclic AWG demultiplexer and a cyclic Echelle grating multiplexer. Different from the beam combiner 140 which may be a simple optical power combiner, the beam splitter 170 is a wavelength-selective splitter that splits the received WDM signals at different WDM wavelengths into different optical signals at different WDM wavelengths along different output optical paths. Optical detectors 172 are coupled to receive the input WDM signals and to convert the received input WDM signals into different electrical detector signals 175, respectively. RF signal amplifiers 174 may be provided to amplify the signals 175.

Figure 3:
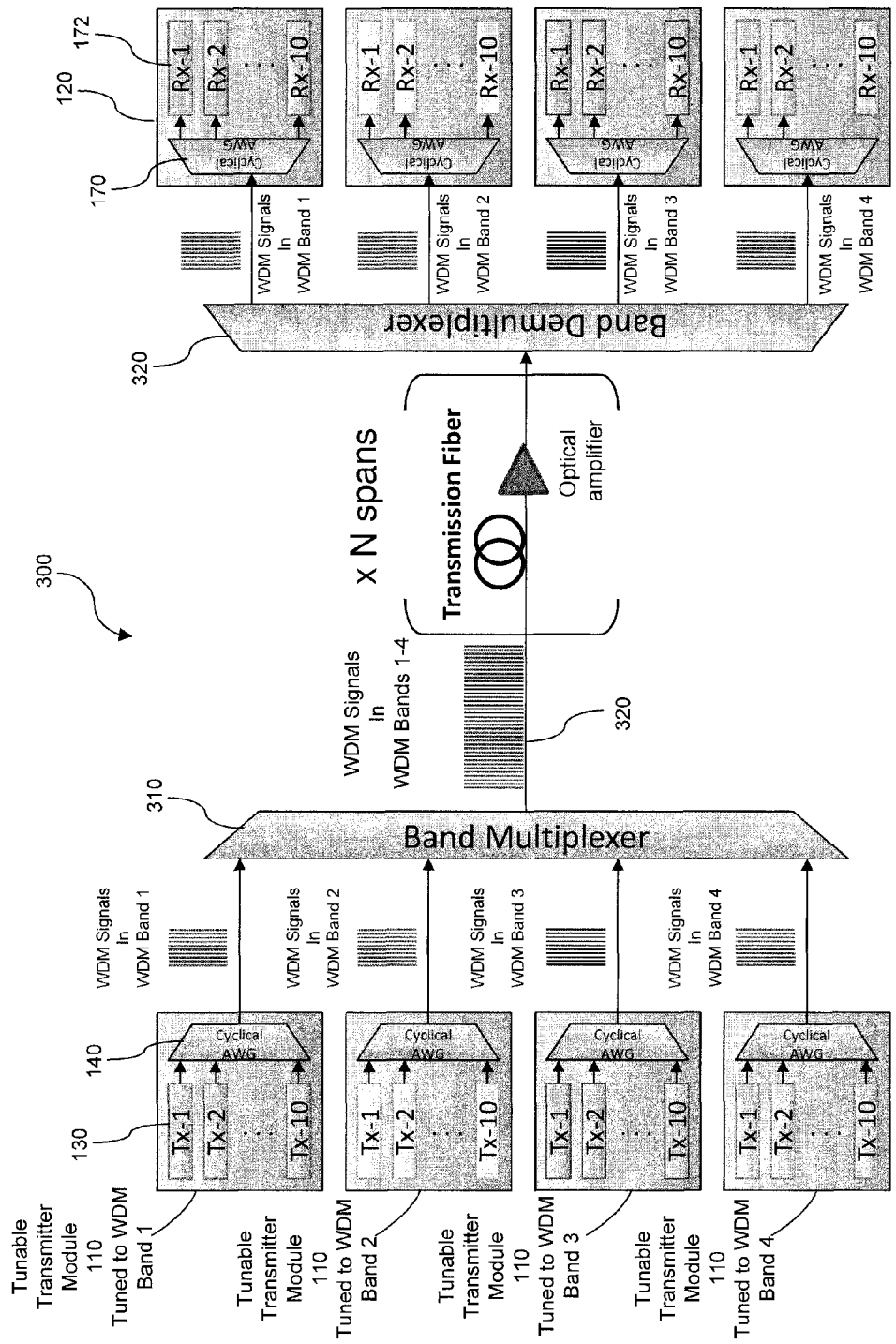
FIG. 3 shows an example of a WDM system by using the tunable transceiver in FIG. 1.

The tunable transceiver 100 in FIG. 1 can be implemented in a fiber WDM transmission system such as the example in FIG. 3 that uses a bank of identically constructed tunable transmitter modules 110 that are tuned to different WDM sub-bands of a WDM band. In a high-speed fiber WDM system, two or more tunable transceivers 100 in FIG. 1 can be used as tunable laser transmitter modules to form a tunable multi-wavelength transceiver. The fiber WDM transmission system 300 in FIG. 3 shows only the transmitter subsystem on the transmitter side of the system 300 and the receiver subsystem on the receiver side of the system 300 where a transmission fiber link 320 connects the two sides of the system 300. A complete tunable multi-wavelength transceiver subsystem includes both the illustrated the transmitter subsystem and the receiver subsystem. More specifically, the complete tunable multi-wavelength transceiver subsystem on one side of the transmission fiber in FIG. 3 includes tunable laser transmitter modules 110, a band combiner or multiplexer 310, a band demultiplexer 320, and optical receiver modules 120.

The tunable laser transmitter modules 110 transmit WDM signals at different WDM sub-bands within a WDM band, respectively. Each tunable laser transmitter module 110 produces laser light of different WDM signals in a respective WDM sub-band and has a structure shown in FIG. 1. The band multiplexer 310 is coupled to receive WDM signals at the different WDM sub-bands from the tunable laser transmitter modules 110 and combines the received WDM signals into a combined WDM optical output for transmission over the transmission fiber 320. The band demultiplexer 320 is coupled to receive an input WDM signal carrying input WDM signals at the different WDM sub-bands from the transmission fiber 320 and separates the WDM signals into different groups of input WDM signals within the different WDM sub-bands, respectively, along different optical paths. Optical receiver modules 120 are provided to receive the different groups of input WDM signals at the different WDM sub-bands, respectively. Assuming a complete tunable multi-wavelength transceiver subsystem includes there are M tunable transmitter modules 110 in the transmitter subsystem and M receiver modules 120 in the receiver subsystem, the total data transmission capacity of the system is $$M \times (n \times m) \text{ Gb/s}$$

where n is the number of tunable laser modules 130 in each tunable transmitter module 110 and m is the data rate in Gb/s for each WDM channel.

In implementing the system in FIG. 3, a 10×10 Gb/s Pluggable optical module may be implemented to cover the whole C-band. The whole C band spectrum from 1529 nm to 1560 nm offers a usable spectrum of about 4 THz. This spectrum may be covered by four tunable Pluggable optical modules, with each covering a WDM sub-band occupying a quarter of the C-band spectrum. Each pluggable optical module may be implemented with a 100-GHz space WDM to cover a 1-THz range or a quarter of the C-band spectrum. The optical output of four different pluggable optical modules occupying different segments of the C-band spectrum can be further sub-band multiplexed with an intermediate WDM (IWDM) shown as band multiplexer in FIG. 3 to pack the 4×10×10 G outputs onto a single transmission path.

In actual deployment of the system 300 in FIG. 3, the basic transceiver building block is the tunable transceiver 100 in FIG. 1. Multiple identical tunable transceivers 100 in FIG. 1 are used in the complete tunable multi-wavelength transceiver subsystem but are tuned to operate in different WDM sub-bands within a WDM band as shown in FIG. 3. There is no need to maintain different transceivers for operating in different WDM sub-bands. Therefore, the design of the system 300 in FIG. 3 is to provide flexibility and simplicity in implementation and inventory management and to reduce the costs for constructing and maintaining the system 300.

The above described example of a tunable multi-wavelength transceiver subsystem in FIG. 3 can be integrated to provide a compact device package. For example, the transmitter module 110 having tunable lasers 132, optical modulators 134, the beam combiner 140, and other components can be monolithically or hybridly integrated. Similarly, in the receive path, the receiver module 120 having the beam splitter 170, the photodetectors 172, and signal amplifiers 174 can be monolithically or hybridly integrated. Various semiconductor laser designs can be used to achieve desired device integration. In some implementations, the transmitter module 110 and the receiver module 120 can be completely integrated together as a single unit.

Figure 4A:
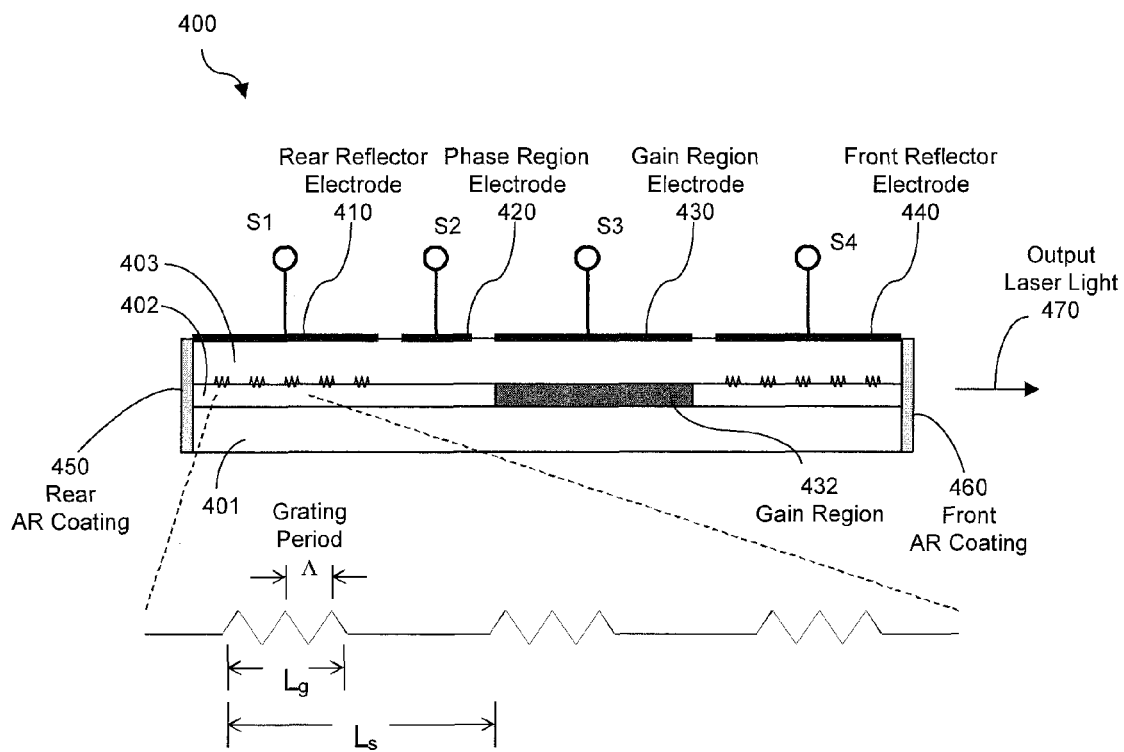
FIGS. 4A-B and 5 show a tunable sampled grating distributed Bragg reflector (SG-DBR) laser and its tuning operation.

For example, the tunable laser 132 can be a tunable sampled grating distributed Bragg reflector (SG-DBR) laser and the array of SG-DBR lasers 132 in FIG. 1 can be integrated. FIG. 4A shows an example of a SG-DBR laser 400 for implementing the tunable laser 132 in FIG. 1.

In FIG. 4A, the SG-DBR laser 400 includes a substrate and a semiconductor structure formed on the substrate to include a first semiconductor layer 401 and a second semiconductor layer 403, and a waveguide layer 402 formed between the first and second semiconductor layers 401 and 403. In some implementations, the first and second semiconductor layers 401 and 403 may have refractive indices less than the refractive index of the waveguide layer 402, e.g., by having different mixing ratio of compound materials with different compositions. The optical waveguide formed by the layers 401, 402 and 403 confines and guides laser light generated by the SG-DBR laser 400 along the optical waveguide. The semiconductor structure for the SG-DBR laser 400 is structured to include a first sampled Bragg grating region forming the rear reflector, and a second sampled Bragg grating region spaced from the first sampled Bragg grating region and forming the front reflector. A rear reflector electrode 410 is formed in the first sample Bragg grating region to apply an electrical signal S1 for tuning and controlling the Bragg resonance condition for the rear reflector, and a front reflector electrode 440 is formed in the second sample Bragg grating region to apply an electrical signal S4 for tuning and controlling the Bragg resonance condition in the front reflector. Each sampled Bragg grating can be formed in or near the waveguide layer 402 to interact with the laser light guided in the optical waveguide. The rear and front reflectors form a Fabry-Perot resonator as the laser cavity for the SG-DBR laser 400. An optically active gain region is formed between the rear and front reflectors to provide the optical gain for the SG-DBR laser 400. The gain region is capable of being electrically energized to produce the optical gain and can be a quantum well structure. A gain region electrode 430 is formed in the gain region 432 to apply an electrical signal S3 to electrically excite the gain region 432 to generate the laser light. Multiple lasers can be formed on the same substrate.

The rear reflector can be configured as a high reflector to reflect the laser light and the front reflector can be structured to form a partial reflector to the laser light to reflect part of the laser light back towards the rear reflector and to transmit part of the laser light as a laser output 470 of the SG-DBR laser 400. A rear anti-reflective coating 450 may be formed on the rear end facet of the semiconductor structure near the rear reflector to reduce undesired optical feedback from the rear end facet and a front anti-reflective coating 460 may be formed on the front end facet of the semiconductor structure near the front reflector to reduce undesired optical feedback from the front end facet.

The laser wavelength of the SG-DBR laser 400 is tuned by controlling either or both of the front and rear reflectors via the control signals S1 and S4 to operate at a laser wavelength where both a reflectivity peak of the front reflector and a reflectivity peak of the rear reflectors align with each other. An electrical current is applied to either or both the rear and the front reflectors to achieve wavelength tuning by changing the refraction index and moving the reflectivity peaks in wavelength. In some implementations, the electric current may be applied to only one of the two reflectors in the SG-DBR laser 400, e.g., the rear reflector while maintaining the front reflect in a fixed Bragg grating configuration, and therefore adjusting only the refractive index of one reflector while maintaining the refraction index of the other reflector at a constant.

The example of the SG-DBR laser 400 in FIG. 4A also shows a phase section formed in the semiconductor structure between the first and second sampled Bragg grating reflectors that is electrically controlled to control a phase of the laser light inside the laser cavity. A phase region electrode 420 is formed to effectuate this phase section and is shown to be between the rear reflector and the gain region in this example. A phase control electrical signal S2 is applied via the phase region electrode 420 to adjust the refractive index of the phase section to change the phase of the laser light in providing a desired phase matching condition for sustaining the laser oscillation within the laser cavity.

Figure 4B:
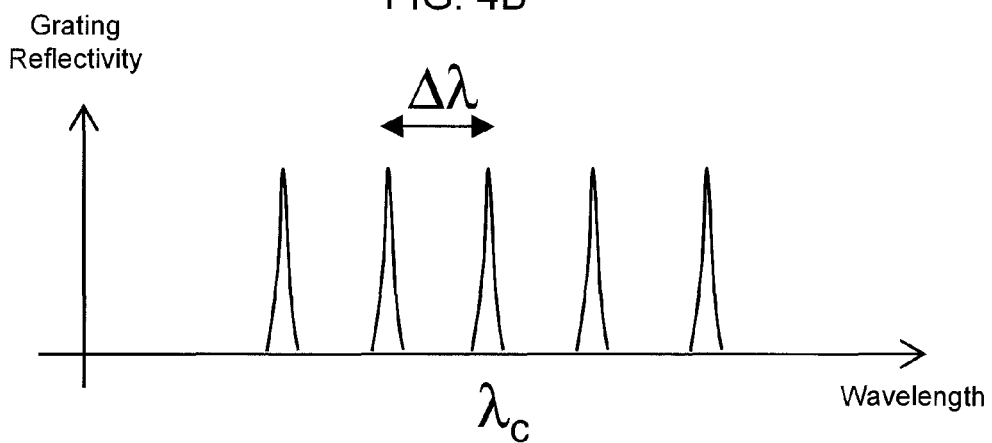

The insert in FIG. 4A shows the structure of the sampled Bragg grating for the rear reflector that includes discrete sections of gratings with a grating period or pitch Λ which determines the reflectivity center wavelength of the sampled grating, and a grating length $L_g$ for each grating section which is related to the grating reflectivity. The sampled Bragg grating has a sampling period length of $L_s$ which is the spacing between the interrupted gratings or adjacent sections of gratings. The optical spectrum of the reflection from the sampled Bragg grating reflector is a series of reflection peaks (as shown in FIG. 4B) at different wavelengths meeting the Bragg resonance condition and the separation of the reflectivity peaks is:

$$\Delta \lambda_s = \frac{\lambda^2}{2 n_g L_s}$$

where $n_g$ is the effective group index of refraction of the waveguide. $L_s = L/N_s$, where L is the total length of the sampled grating in each reflector and $N_s$ is the number of sampling periods.

Figure 5:
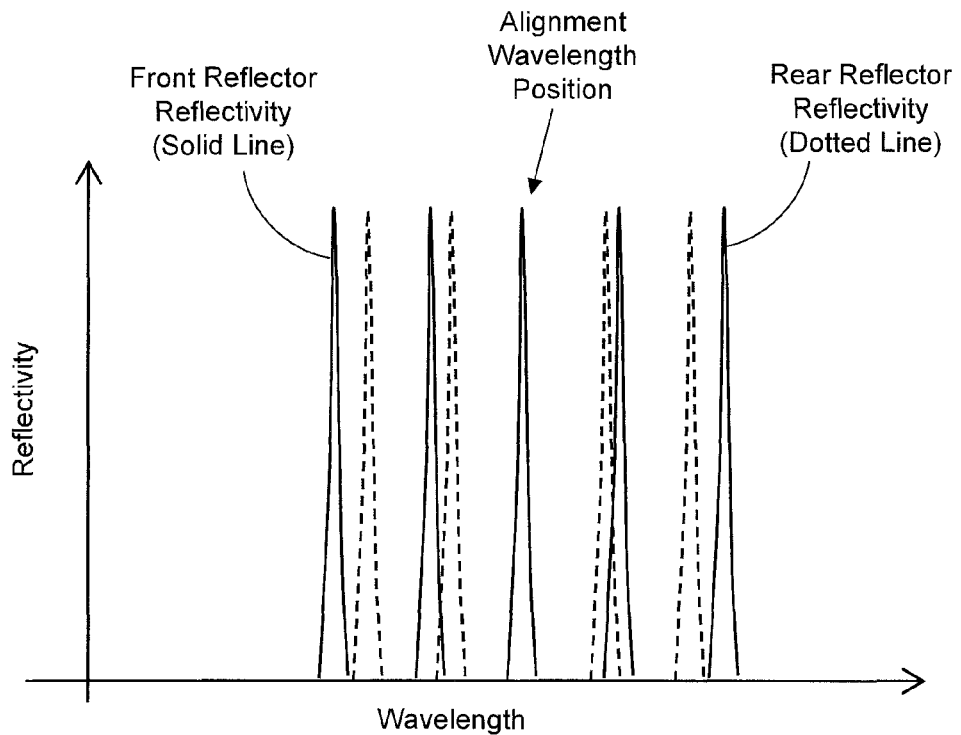

FIG. 5 shows the comb-like reflection spectrum, known as the Vernier effect, achieved by the sampled grating of the rear reflector and the front reflector. The comb-like reflection spectrum of the front reflector is represented by the solid line and the reflection spectrum of the rear reflector is represented by the dotted line, both achieved by periodic sampling of the gratings of the front grating and rear grating.

The sampling periods of the front and rear reflectors may be chosen to have a slight mismatch to produce two reflectivity-versus-wavelength spectra with slightly different periodicities as shown in FIG. 5. In this situation, only one of reflection peaks in each of the two spectra may be aligned with the other, for example, the alignment as marked in FIG. 5. Thus the wavelength of the SG-DBR laser 400 may be controlled by altering the alignment of the reflectivity peaks from the rear reflector and the front reflector. In this way, a wide tuning range for the laser wavelength may be achieved.

The tuning range of an SG-DBR laser 400 is determined by the ratio of sampling period $L_s$ and grating length $L_g$. Therefore longer sampling period length $L_s$ and shorter grating length $L_g$ are advantageous for achieving wide tuning range. In order to access all the wavelengths within a desired tuning range, the wavelength jump step should be sufficiently small to allow the gaps to be filled by simultaneous tuning of the rear and the front reflectors of the tunable SG-DBR laser 400. For example, discrete tunable lasers built for a DWDM system with a 100 GHz wavelength spacing regularly require a fine jump step of 0.8 nm.

To reduce the step of wavelength jump, the sampling period length $L_s$ should be increased, and the number of sampling periods $N_s$ should also be increased to obtain the same amount of power reflectivity when the sampling period length $L_s$ increases. However, a greater optical loss and an increase in device size would result from an increase in the sampling period length Ls and the number of sampling periods and a reduction in the grating length. Furthermore, an integrated semiconductor optical amplifier (SOA) outside the laser cavity on the same substrate may be used to increase the optical power output of the SG-DBR 400. This addition of the SOA increases the size of the device and makes large-scale integration a challenge.

Such trade-offs in tuning range, tuning step, and optical performance may be addressed by tuning at a coarse step and preferably by tuning only one of the reflectors in the SG-DBR laser 400.

Figure 6:
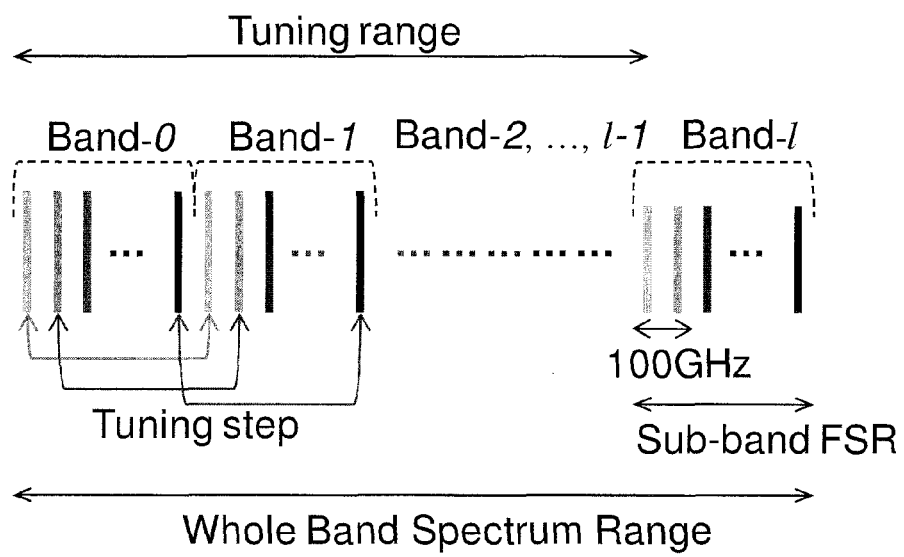
FIG. 6 shows one example of tuning an array of lasers based on the laser design in FIG. 4A.

FIG. 6 shows a spectrum illustrating the coarse step tuning where the whole band spectrum (for example, C-band or L-band) is divided into multiple sub-bands from band-0 to band-l. The tunable SG-DBR laser 400 can be tuned at a coarse step to hop from one sub-band to the next sub-band. The frequency range of each sub band may be set to n×Δf, where Δf is the channel spacing, n is the number of tunable lasers in an array. Thus, an operating spectrum range can be divided into $$l = \frac{\text{spectrum}}{n \times \Delta f}$$

number of sub bands, l is also the number of wavelengths that each laser in the array could be tuned to in the whole spectrum band. For example, for the whole C band (wavelength from 1529 nm to 1560 nm) with 100 GHz (0.8 nm) wavelength spacing, the number of sub bands that can be obtained is $$l = \frac{32 \text{ nm}}{n \times 0.8 \text{ nm}}.$$

Thus, for a laser array of n tunable lasers, each laser is tuned discontinuously at a tuning step of n∴Δf. For example, in FIG. 6 where wavelength spacing is 100 GHz, the tuning step of a laser array of n tunable lasers is n×100 GHz (or n×0.8 nm). By tuning at a much coarser step, sampling period length $L_s$ in the SG-DBR laser 400 may be shortened and the optical power output is increased as a result of reduced optical loss. As a result, an integrated SOA on the same substrate with the SD-DBR laser 400 may become optional and the SG-DBR device may therefore be made simpler and more compact.

In implementations where a laser array for an optical WDM transmitter such as the example in FIG. 1 is formed of multiple SG-DBR lasers 400, each SG-DBR laser 400 in the laser array may be designed with a different grating pitch λ from other SG-DBR lasers 400 so the comb-like reflection spectra of the lasers 400 are shifted from one another by one or more channel spacings of the WDM wavelengths which may follow the ITU WDM grid (e.g., 100 GHz or 50 GHz). Referring to FIG. 1 where each tunable laser 132 is a SG-DBR laser 400 in FIG. 4A and further referring to FIG. 6, the first laser in the laser array for the WDM channel 1 may be tuned to a central wavelength $\lambda_1$ in sub-band-0, and be tuned to $\lambda_{n \times \Delta \lambda + 1}$ in the next band, band-1. The second laser for the WDM channel 2 may have a wavelength $\lambda_2$ in sub-band-0 and hop to $\lambda_{n \times \Delta \lambda + 2}$ in the next band, the third laser for the WDM channel 3 with a wavelength $\lambda_3$ in sub-band-0 and $\lambda_{n \times \Delta \lambda + 3}$ in the next band, and the nth laser with a wavelength $\lambda_n$ in sub-band-0 and $\lambda_{n \times \Delta \lambda + n}$ in the next band. For example, in C-band, Δλ=0.8 nm for 100 GHz intra-sub-band channel spacing as shown in FIG. 6. In this scenario, each sub-band 0-l is filled by the wavelengths from the lasers in the laser array. One of the advantages of the above coarse tuning is that the laser modes are widely separated and, accordingly, the mode suppression ratio (MSR) can be improved.

Figure 7:
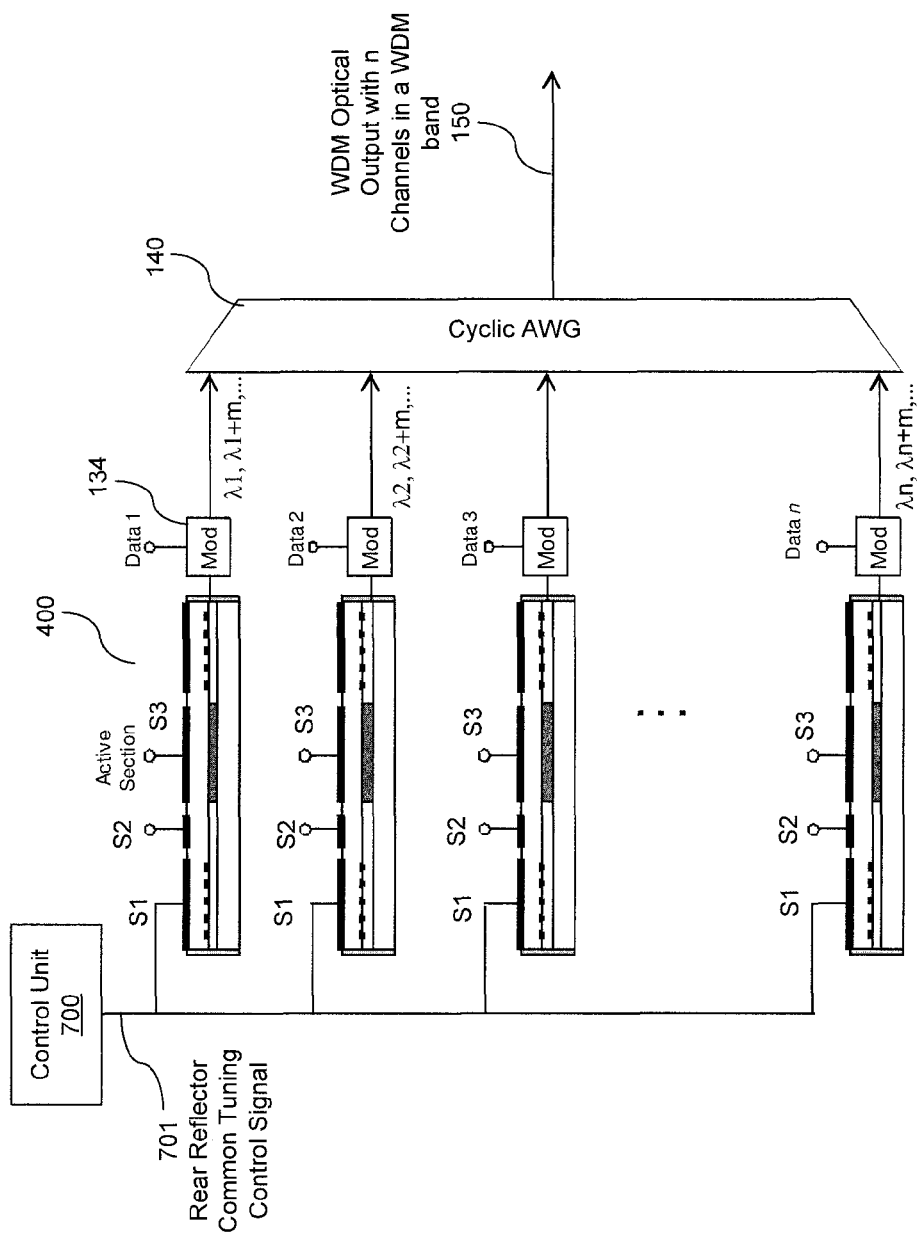
FIG. 7 shows one implementation of a laser array of SG-DBR lasers in implementing the tunable transmitter module in FIG. 1.

FIG. 7 shows one implementation of a laser array of SG-DBR lasers 400 in implementing the tunable transmitter module 110 in FIG. 1. The tunable SG-DBR circuit may be made compact in size by tuning only one of the front or rear reflectors in each laser and thereby reducing a separate control circuit for controlling the other reflector. In this implementation, only the sampled Bragg grating of the rear reflector in each laser 400 is tuned while the sampled Bragg grating of the front reflector that outputs the laser light to the optical modulator 134 is maintained at a fixed Bragg grating configuration and is not tuned. The electrodes for the rear reflectors of all lasers 400 are connected to a common control signal 701 from a common control unit or circuit 700 that is used to simultaneously synchronously tune all rear reflectors in the lasers 400. The control unit 700 can be located within the same module where the lasers 400 are in some implementations or be placed separate from the lasers 400. In an integrated design where the lasers 400 are on the same chip, the control unit 700 may be integrated on the same chip. The control unit 700 controls the lasers 400 to produce laser light at different optical WDM wavelengths in different WDM sub-bands, respectively and adjusts the common tuning control signal 701 to synchronously tune all of the lasers 400 at the same time. Each laser 400 in the array may be simultaneously tuned to each respective wavelength in the next sub-band. By filling each sub-band with wavelengths from different laser sources and simultaneous tuning of these laser sources, a continuous tuning over the whole spectrum range is possible.

One of benefits for tuning only the rear reflector while maintaining the front reflect at a fixed configuration is to decrease the front grating tuning absorption loss and to obtain a higher optical output power from the front end of the SG-DBR laser 400. This design can increase the overall optical output of the laser 400 and may ultimately to avoid the use of a SOA for boosting the laser output. In implementations, the front reflector may be designed with a fixed reflectivity spectrum and a low number of sampling periods to reduce the size of the laser 400. The design of adjusting only the controlling current applied to the rear reflector can increase the precision of reflection alignment and decrease the probability of mode jumps of the SG-DBR laser 400 to improve the laser stability.

Alternative to the above SG-DBR laser 400, one of the two reflectors of a tunable laser can be a fixed, non-tunable grating reflector formed of a series of cascaded single-wavelength gratings to produce different reflectivity peaks at different wavelengths, respectively while the other reflector is a tunable sampled Bragg grating. For example, the front reflector can be the fixed grating reflector having a series of cascaded single-wavelength gratings and the real reflector is a tunable sampled Bragg grating. The different reflectivity peaks of the cascaded single-wavelength gratings can be configured to be pre-aligned with various reflectivity peaks within the tuning spectral range of the tunable rear sampled Bragg grating to allow for tuning the tunable rear sampled Bragg grating to cause lasing at these reflectivity peaks.

While the laser array of the SG-DBR lasers 400 provides wide tuning range for generating different WDM wavelengths in various WDM sub-bands, the tuning range of each individual SG-DBR laser 400 in the laser array is relatively small. For example, to cover the full range of a 32 nm C-band with a wavelength from 1529 nm to 1560 nm, a wavelength spacing of 100 GHz (0.8 nm) and a number of l sub bands, the tuning range of each laser in a laser array may only be a ratio of (l−1)×(32/l) nm. When l=4, the tuning range of each laser needs only to be 24 nm, as compared to a 32 nm of a traditional SG-DBR. As explained above, the tuning range of a SG-DBR laser is determined by the ratio of sampling period length $L_s$ and grating length $L_g$, and $L_s$ is the ratio of the total sampled grating length L over the number of sampling periods $N_s$. Therefore, when a tuning range decreases, the grating length $L_g$ may be increased and the number of sampling periods $N_s$ may be reduced to provide enough reflectivity. In this way, the SG-DBR laser array structure may be made more compact.

To compensate for transmission loss and reduce the spurious components interfering other wavelengths when the laser is tuned from one band to another, a SOA with suitable gain profiles may be provided outside the laser 400 before and/or after the modulator 134 to increase the optical carrier signal level and/or the modulated output signal. Alternatively, due to various features described above, such as coarse tuning step, reduced sampling period length and increased output power in the present design, the SOA may be selectively omitted from the circuit design.

Figure 8:
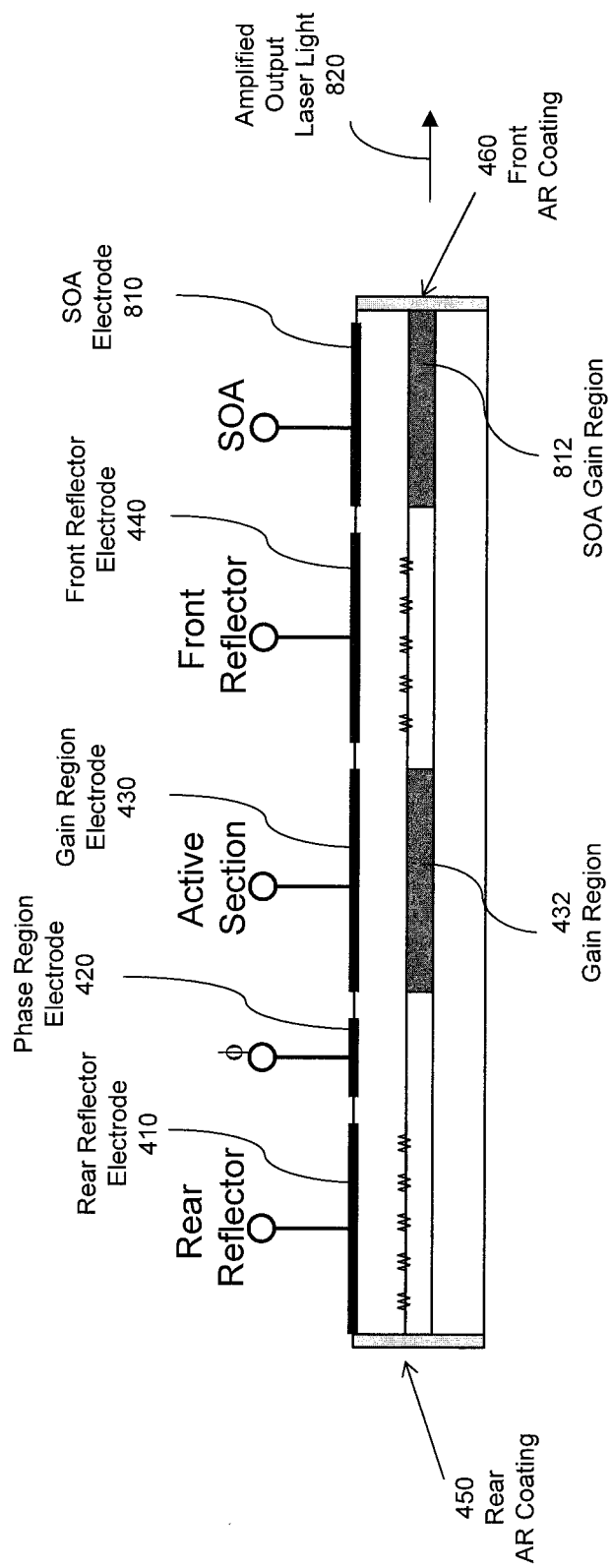
FIG. 8 shows one example for including semiconductor optical amplification (SOA) function in a tunable optical transmitter or transceiver module.

FIG. 8 shows an example of a tunable SG-DBR laser with an integrated SOA in the same semiconductor structure where the laser is formed. A SOA region 812 is formed in the waveguide outside the laser resonator formed by the two reflectors 410 and 440, e.g., between the front reflector 440 and the front AR-coated facet 460. The output laser light from the from the front reflector of the laser is directed along the waveguide into the SOA gain region 812 which is electrically energized by the signal applied to the SOA electrode 810 to produce the optical gain that amplifies the output laser light as the amplified output laser light 820.

Figure 9:
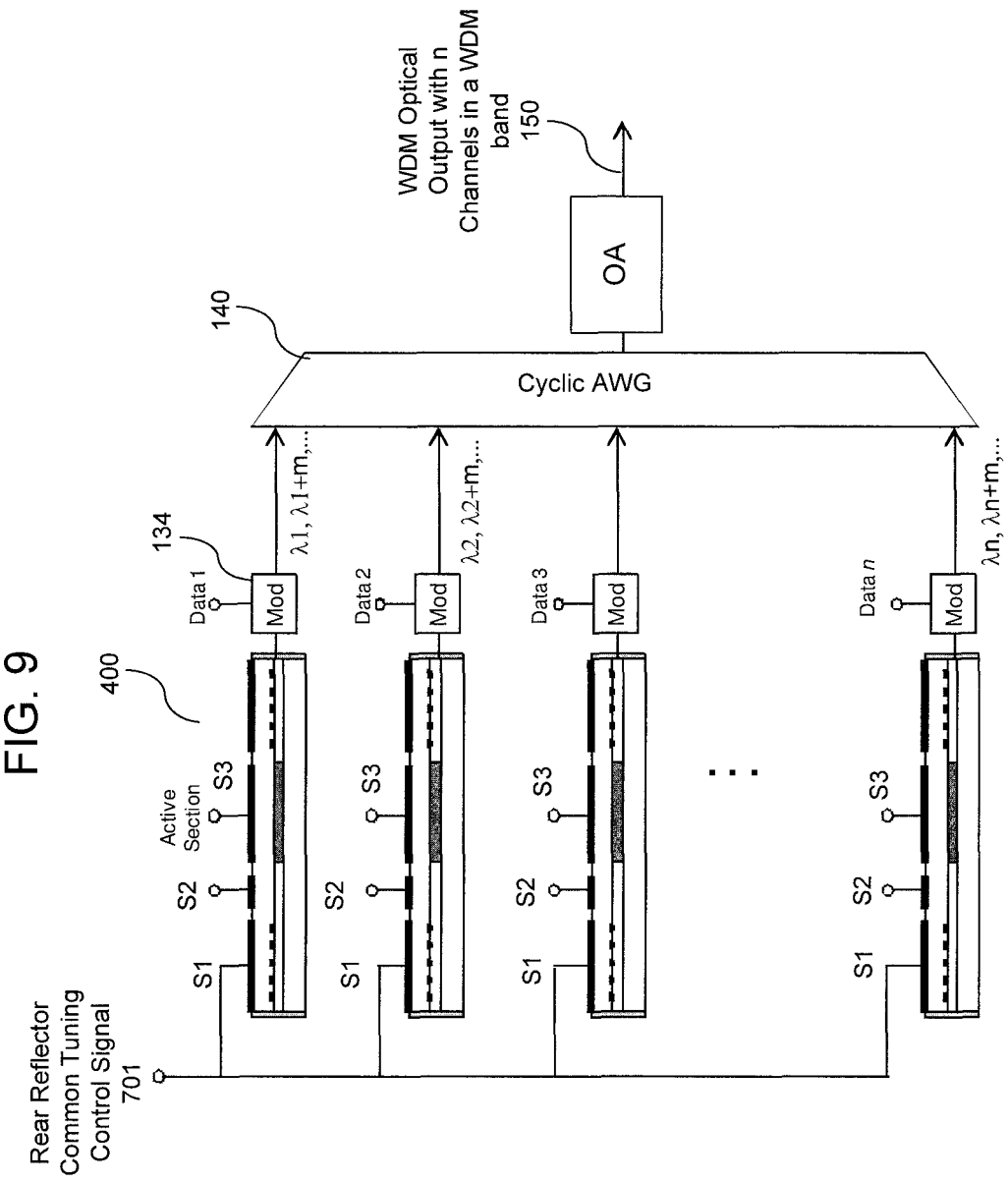
FIG. 9 shows another example for including an optical amplifier in a tunable optical transmitter or transceiver module.

In some applications, a common optical amplifier can be used to amplify light from the array of the tunable lasers. FIG. 9 shows an example of an optical transmitter module that includes an optical amplifier at the output of the beam combiner 140. This amplifier can be an SOA and can be integrated to the semiconductor structure in which the lasers 400, the optical modulators 134 and the cyclic AWG combiner 140 are formed. This single SOA is shared among all the individual wavelengths in the WDM sub-band.

While this specification contains many specific implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, the separation of various system components in the embodiments described above should not be understood as requiring such separation in all embodiments.

Thus, particular embodiments of the invention and their implementations are disclosed. Variations, modifications and enhancements of the disclosed embodiments and implementations and other embodiments and implementations can be made based on what is described and illustrated in this specification.

What is claimed is:

1. A device for producing laser light at different optical wavelengths, comprising:
an array of tunable lasers that each emit laser light that is a channel spacing wavelength away from the laser light of an adjacent tunable laser in the array, wherein each tunable laser in the array includes:

a tunable sampled Bragg grating reflector for producing laser light having reflectivity peaks within a tunable spectral range, wherein the tunable sampled Bragg grating reflector is coupled to be tuned by a common control signal;

a second grating reflector that is spaced from the tunable sampled Bragg grating reflector to form an optical resonator with the tunable sampled Bragg grating reflector; and a gain section between the tunable sampled Bragg grating reflector and the second grating reflector, the gain section capable of being electrically energized to amplify the laser light; and a laser control unit coupled to control the common control signal to synchronously tune the tunable sampled Bragg grating reflector of each tunable laser from a first sub-band within a first band of the tunable spectral range to a second sub-band within a second band of the tunable spectral range, wherein the first sub-band is a coarse tuning step from the second sub-band and the coarse tuning step is approximately equal to a number of the tunable lasers in the array multiplied by the channel spacing wavelength.

2. The device as in claim 1, wherein:
the second grating reflector includes a series of fixed optical gratings that respectively reflect light at different second grating reflector resonance wavelengths that are fixed in wavelength and are not tunable.

3. The device as in claim 1, wherein:
the second grating reflector includes a second sampled Bragg grating reflector.

4. The device as in claim 3, wherein:
sampling periods of the sampled Bragg grating reflector and the second sampled Bragg grating reflector are different.

5. The device as in claim 3, wherein:
a number of sampling periods in the sampled Bragg grating reflector is higher than a number of sampling periods in the second sample Bragg grating reflector to output the laser light out of a respective tunable laser through the second sample Bragg grating reflector.

6. The device as in claim 1, wherein:
each tunable laser includes a phase section with the optical resonator that is electrically controlled to control a phase of the laser light.

7. The device as in claim 1, wherein:
the sampled Bragg grating reflector has a sampling period greater than a grating period.

8. The device as in claim 1, comprising:
a substrate; and
a semiconductor structure formed on the substrate and patterned to form the tunable lasers.

9. The device as in claim 1, wherein:
each tunable laser produces continuous wave (CW) laser light at a respective optical wavelength; and
the device comprises an array of optical modulators that are located outside the optical resonators of the tunable lasers to receive the CW laser light from the tunable lasers, respectively, each optical modulator modulating respective CW laser light from a respective tunable laser to produce a modulated optical signal carrying information.

10. The device as in claim 1, wherein:
each tunable laser produces continuous wave (CW) laser light at a respective optical wavelength; and
the device comprises an array of optical modulators that are located outside the optical resonators of the tunable lasers to receive the CW laser light from the tunable lasers, respectively, each optical modulator modulating respective CW laser light from a respective tunable laser to produce a modulated optical signal carrying information.

11. The device as in claim 1, wherein:
each tunable laser directly produces modulated laser light carrying information.

12. The device as in claim 1, comprising:
an array of optical amplifiers that are located to receive, respectively, the laser light from the tunable lasers, each optical amplifier amplifying the laser light received from a respective tunable laser.

13. The device as in claim 12, comprising:
a semiconductor structure patterned to form the respective tunable laser, wherein a respective optical modulator is formed in the semiconductor in which the respective tunable laser is formed.

14. The device as in claim 1, wherein:
the laser control unit synchronously tunes the different optical wavelengths of the tunable lasers discretely by a common amount of change in wavelength without changing a relative spacing between the different optical wavelengths.

15. The device as in claim 1, comprising:
a beam combiner coupled to receive the laser light from the tunable lasers at different optical wavelengths to produce a combined optical output; and
an optical amplifier coupled to receive the combined optical output from the beam combiner and amplifying the combined optical output.

16. A device for producing laser light at different optical wavelengths, comprising:
a substrate;
a semiconductor structure formed on the substrate and patterned to form an array of tunable lasers to produce laser light at the different optical wavelengths that are separated by a channel spacing, respectively, each tunable laser including a tunable sampled Bragg grating reflector responsive to a control signal to tune a respective optical wavelength produced by the tunable laser, wherein a sampling period length of the tunable sampled Bragg grating reflector creates a discontinuous wavelength tuning step from a first sub-band within a first band to a second sub-band within a second band, wherein the discontinuous wavelength tuning step is approximately equal to a number of the tunable lasers in the array of tunable lasers, multiplied by, a channel spacing between the different optical wavelengths of the tunable lasers in the array; and
a laser control unit coupled to the tunable lasers to apply a common control signal to the tunable lasers as the control signal to each tunable sampled Bragg grating reflector to synchronously discontinuously tune the tunable lasers that operate at the different optical wavelengths, respectively.

17. The device as in claim 16, wherein:
the laser control unit tunes the different optical wavelengths of the tunable lasers discretely by a common amount of change in wavelength without changing a relative spacing between the different optical wavelengths.

18. The device as in claim 16, wherein:
the laser control unit tunes the different optical wavelengths of the tunable lasers discretely by a common amount of change in wavelength equal to a spectral width of each transmission band of a common transmission spectral profile without changing a relative spacing between the different optical wavelengths.

19. The device as in claim 18, comprising:

an optical amplifier formed in the semiconductor structure to receive and amplify a combined optical output from a beam combiner.

20. The device as in claim 18, comprising:

optical amplifiers formed in the semiconductor structure and located to receive and amplify the laser light from the tunable lasers, respectively.

\* \* \* \* \*